United States Patent
Lindberg et al.

(10) Patent No.: US 7,577,928 B2
(45) Date of Patent: Aug. 18, 2009

(54) VERIFICATION OF AN EXTRACTED TIMING MODEL FILE

(75) Inventors: Peter Lindberg, Maple Grove, MN (US); Richard K. Kirchner, Bloomington, MN (US); Sandeep Bhutani, Pleasanton, CA (US)

(73) Assignee: LSI Logic Corporation, Milpitas, CA (US)

(*) Notice: Subject to any disclaimer, the term of this patent is extended or adjusted under 35 U.S.C. 154(b) by 244 days.

(21) Appl. No.: 11/376,781

(22) Filed: Mar. 15, 2006

(65) Prior Publication Data

US 2007/0220462 A1    Sep. 20, 2007

(51) Int. Cl.
*G06F 17/50* (2006.01)
(52) U.S. Cl. .................................. 716/4; 716/5; 716/6
(58) Field of Classification Search ............ 716/4, 716/5, 6
See application file for complete search history.

(56) References Cited

U.S. PATENT DOCUMENTS

2005/0198601 A1* 9/2005 Kuang et al. ................. 716/6

* cited by examiner

*Primary Examiner*—Thuan Do
(74) *Attorney, Agent, or Firm*—Ryan, Mason & Lewis, LLP (57) ABSTRACT

A system, apparatus and method for generating and validating extracted timing model files, such as macro library files, are disclosed. A user interface or data template is provided to an engineer that allows for the population of data within particular fields related to timing characteristics of an IP block, cell or core. An extracted timing model file is generated and a validation procedure is performed. This validation procedure may include comparing the information with the file to a test bench have a plurality of test points. In particular, data provided by the engineer is checked against multiple criteria to ensure that this data is valid and/or falls within an appropriate value range constraints. After the validation procedure has completed, the engineer is provided a summary of the validation results.

21 Claims, 7 Drawing Sheets

VERIFICATION OF AN EXTRACTED TIMING MODEL FILE

CROSS-REFERENCE TO RELATED APPLICATIONS

The application is related to commonly assigned, U.S. patent application Ser. No. 11/351,091, entitled "Generation of an Extracted Timing Model File," filed on Feb. 9, 2006, which is incorporated herein in its entirety.

BACKGROUND

A. Technical Field

The present invention relates generally to electronic design automation ("EDA") tools, and more particularly, to the verification of an extracted timing model generated for a block, macro or core.

B. Background of the Invention

The importance and rapid growth of electronics technology is well known. Integrated electrical systems are continually being reduced in size while continually increasing in design complexity. These advancements have led to rising clock frequencies and shrinking process geometries, increasing the emphasis on signal integrity effects such as IR drops, crosstalk delay and other noise features.

The design of a System-On-Clip (SOC) involves integration of several blocks differing in functionality. In order to minimize the time in designing such complex systems, design reuse has drastically increased in the development of electrical systems. For example, a System-On-Chip ("SOC") may comprise a large number of macros or cores that are designed into a system by multiple engineers or engineering teams. Oftentimes, the design process of a SOC requires that timing components and characteristics of the macros or cores be provided to the various engineers to ensure compatibility between the macros within the SOC. These macros and cores generally include Intellectual Property blocks or cells ("cells") that allow the design to be reused across multiple systems, which further necessitates the need for modeling the timing characteristics of block, macro or core.

Timing characteristics of a cell may be described in an extracted timing model ("ETM"). An ETM describes timing components of the inputs and outputs of the cell. Accordingly, a designer can use an ETM to ensure that other cells within a macro, core and SOC are able to properly interface and effectively communicate within the system. ETMs may be difficult to generate depending on the complexity of the cell that is being modeled. Oftentimes, ETM files must be manually built in order to generate an ETM for a particular cell.

Figure 1:
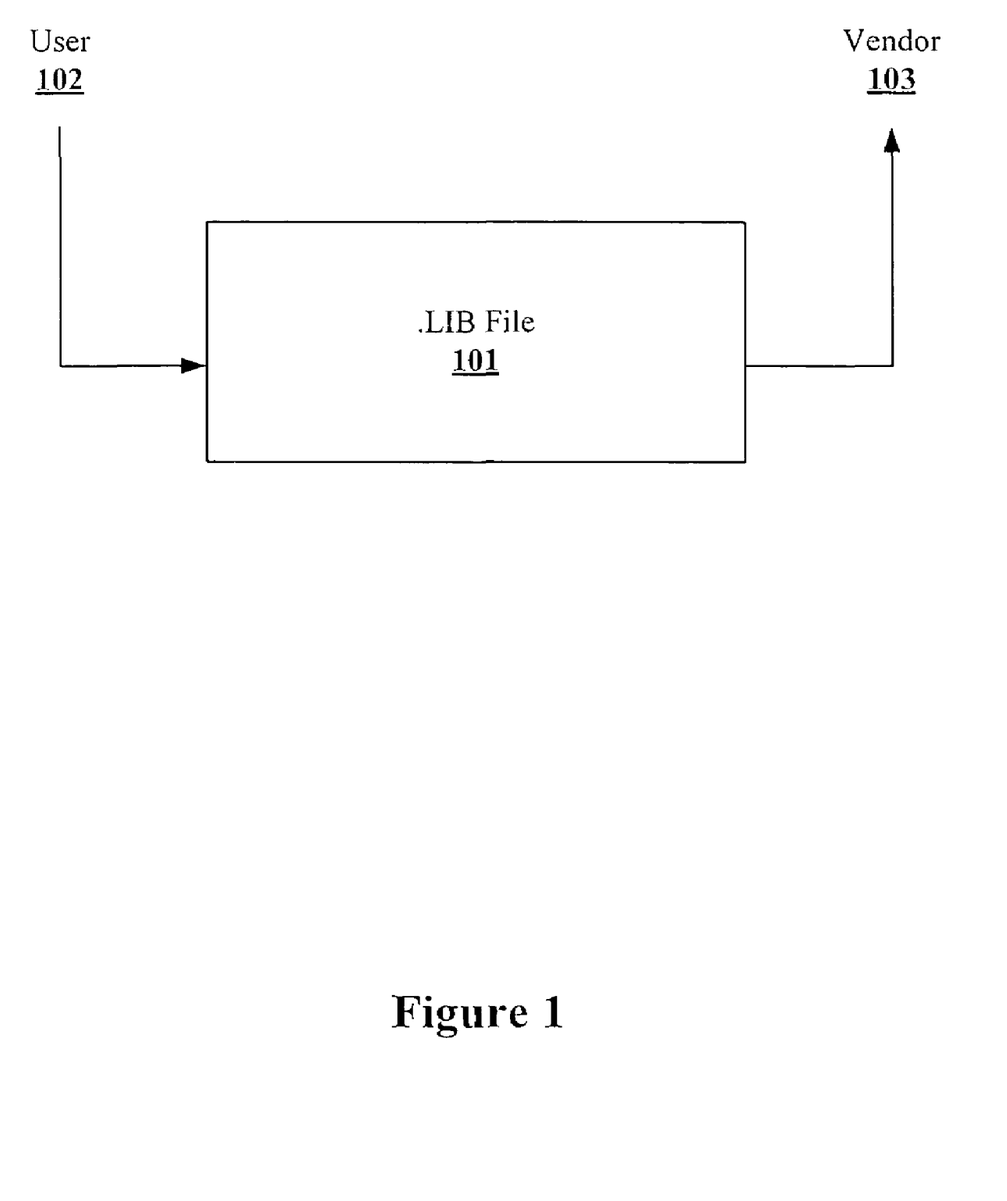

Once this ETM file is generated, it may be used internally within a company to design a system or provided to a customer to allow integration of a cell within a customer's system. One example of an ETM file is the library (".lib") file that corresponds to an original netlist for the cell. As shown in FIG. 1, a user 102 manually generates the .lib file 101 that describes timing characteristics of a cell. This .lib file may be provided to a vendor or customer 103 to allow proper integration of a corresponding cell within a system.

The .lib file contains information that describes timing arcs between input and output pins of a design cell. These timing arcs may contain timing tables which describe timing characteristics between the input and output pins. In particular, the timing tables define timing values as a function of input transition time and output loading. The .lib file may also contain min_periods and area_number attributes.

The .lib files containing timing arcs and tables are used for modeling the timing of input and output pins without involving actual internal nets implementation details. For instance, if a designer needs to integrate a number of different cells in the core, he/she makes use of these .lib files to gain the timing information of the core. Sometimes customers use the timing models depending upon the design stages.

PrimeTime™ is a gate-level static timing analysis tool that is optimized to analyze millions of gates in a short time. Manual generation of a .lib file to model the netlist for which an ETM file is generated may be required when using a delay calculator other than the PrimeTime™ calculator. In such an instance, an engineer is required to manually code the .lib file, which may be complicated and require a large amount of time. An engineer may want to avoid using the PrimeTime™ delay calculator because of the associated cost aspects or its inability to address other signal characteristics such as cross talk and noise.

The PrimeTime™ graphical user interface and command line may be complicated or otherwise difficult for an inexperienced engineer to properly generate an ETM. This interface and manual process of building a .lib file may be complicated, error prone and time consuming. PrimeTime™ also fails to provide certain boundaries or constraints during the generation of an ETM. For example, a user may incorrectly provide a signal frequency or period outside of an appropriate range. Other user input may fall outside of a particular operable boundary resulting in an inappropriate ETM.

The creation of a timing model may involve several iterations. Once a model is created, it is oftentimes essential to validate it relative to different parameters. For example, a validation process may include manually comparing the timing values of the model created to the gate-level netlist.

Effective validation of the model created enables reduction in time to market by overcoming the need of re-verification. The accuracy of the timing model is thus essential in core-based design. In addition, as the number of iterations within the generation of the timing model is reduced, the design time of the electrical system is reduced.

Presently, a verification process is performed manually wherein all the necessary steps required to create and validate an extracted timing model file are checked one-by-one by an individual. This manual process is oftentimes error prone and time consuming. Furthermore, the complexity of the validation process may increase if various steps need to be followed in right order to achieve the aimed model.

SUMMARY OF THE INVENTION

The present invention provides an apparatus and method for generating an extracted timing model file and verifying the generated extracted timing model file relative to one or more validation criteria. In one embodiment of the present invention, an ETM software application is used in which a data template is created and provided. This data template allows the user to efficiently provide information related to a cell or core in response to inquiries or fields within the data template. One or more modes of operation for core operation are identified and location of netlists for core is provided to generate an ETM file, such as a .lib file.

According to one embodiment of the invention, the data template is a user interface comprising multiple rows and columns for allowing a user to enter required information related to timing characteristics of the core or cell. The information may include the location of relevant files, timing constraints, modes of operation, clock frequencies etc. The modes of operation may include various test modes and functional modes.

The data template and the information therein may be used to generate an ETM file. After the data template is filled out, the user may command that an ETM file, such as a .lib file, be generated accordingly. The ETM file is validated relative to one more criteria of a properly generated ETM file. For example, timing constraint checking may be performed to ensure timing characteristics of the ETM file correctly correspond to either the cell being modeled or the system in which it will operate. Timing constraints are often the stumbling block for closing timing on a design and are also a crucial part of creating a good timing model.

This verification process may be performed either during the ETM generation process or after the ETM file has been created. In one embodiment of the invention, a validation flow is provided wherein the timing arcs in the ETM models are analyzed relative to the timing range of the gate level netlist of the cell being modeled. This validation flow is performed by comparing the entries within the ETM model to gate level timing information found within the netlist.

A test bench may be used in the verification process to identify particular elements or characteristics within the ETM file that are to be validated. In particular, a plurality of test points within the test bench are provided in which ETM file characteristics are compared to defined values to ensure that the created ETM file is valid. For example, the test bench may contain one or more test points related to the ETM timing arcs previously described. Cross-checking functionality may be provided such as having the minimum period attribute be specified for a clock that is not defined in the constraints.

Various embodiments of the invention facilitate both an efficient manner in which an ETM file is to be generated and a method for validating the generated ETM file relative to a test bench. In one embodiment of the invention, a user may be provided a summary, including a plurality of PASS/FAIL notifications, which describe the generated ETM file relative to the test bench. Other information, such as a WARNING, may also be provided to the user to enable a more detailed analysis of the ETM file after it is generated.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. ("FIG.") 1 illustrates a general prior art method for providing a .lib file or ETM that may be used to install a cell within a system.

DETAILED DESCRIPTION OF THE PREFERRED EMBODIMENTS

A system, apparatus and method for generating and validating extracted timing model files, such as macro library files, are disclosed. A user interface or data template is provided to an engineer that allows for the population of data within particular fields related to timing characteristics of an IP block, cell or core (these terms are intended to be used synonymously and cover a circuit to be integrated within a larger system). Various types of data and fields may be provided into the user interface or data template. The location of relevant files, such as a cell or core netlist, may also be provided within the template.

Using the data from the data template, a library file or files is generated describing the timing characteristics of the cell. In one embodiment, a validation procedure is performed after the file is generated. This validation procedure may include comparing information within the file to a test bench having a plurality of test points. In particular, data provided by the engineer is checked against multiple criteria to ensure that this data is valid and/or falls within an appropriate range of constraints. After the validation procedure has completed, the engineer is provided a summary of the validation results.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different computing systems and devices. The embodiments of the present invention may be present in hardware, software or firmware. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 2:
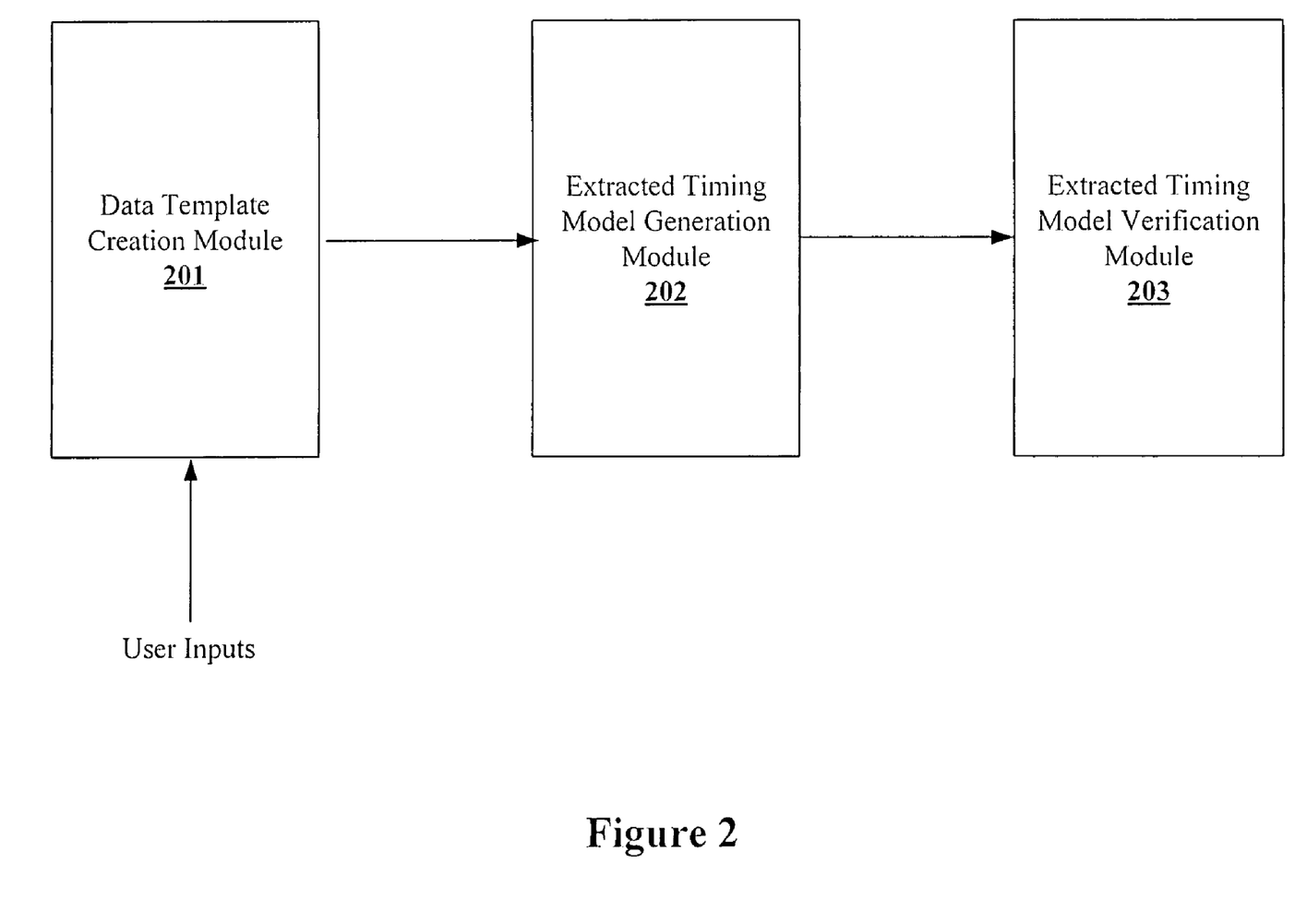
FIG. 2 is a general diagram illustrating a system in which an extracted timing model is generated and validated according to one embodiment of the invention.

FIG. 2 illustrates a system for efficiently generating and verifying an ETM file for a cell or core according to one embodiment of the invention. A user interface or Data Template Creation Module 201 is provided that allows an individual to input certain information relevant to the timing characteristics of a cell. In one embodiment of the invention, the Data Template Creation Module 201 contains a list of fields in which response to questions or locations of files may be provided by the individual. These fields may allow for yes/no responses, responses which may fall within a range of values, open-ended responses or other types of responses. The user interface that facilitates these responses may vary depending on various factors including the type of customer/individual or company using the Data Template Creation Module 201.

The user input may include information such as technology of the core that is being used, or any special custom cells required by the core itself or for reference. Typically, the Data Template Creation Module 204 may ask for the core netlist, but certain other data on the internal net may not be required. For example, an internal source clock may require a certain ramp time on a particular net, but if a core netlist does not have such an internal source clock then this information need not be provided.

The user may be asked to provide a map file, which may be used to create the main mapping file containing the mapping information of the inputs and output pins. The data template file can also include source clock name with specified max frequencies or min periods. It can also have the information such as the speed of the core, which may be high or low. For example, if the core is a high-speed core, the user may be further queried to specify the location of the incremental standard delay format (SDF) file related to the high-speed core. Using the completed Data Template Creation Module 201, a file is created containing information relevant to timing characteristics of the cell.

An Extracted Timing Generation Module 202 processes the information within the Data Template Creation Module 201 and creates a corresponding ETM .lib file. In one embodiment of the invention, the Extracted Timing Generation Module 202 operates according to one of a plurality of modes of operation. These modes may include various test modes and functional modes. The user will identify one or more mode in which the core needs to operate so that the ETM may be generated.

Thereafter, the location of the netlist for the core is provided in order to generate the .lib file for the ETM. Once the ETM .lib file is created, it is set for validation in the ETM Verification Module 203, which validates the ETM .lib file relative to one or more criteria, test bench points or constraints corresponding to the cell or core being modeled.

In one embodiment of the invention, validation flow is provided wherein timing arcs in the ETMs are checked to determine whether they match the timing of the gate level implementation within a specified range. This may be done by creating a test bench, instantiating the generated timing model in an exemplary predefined design. The ETM Verification Module 203 may further verify that all timing arcs are present in the ETM model. The list of timing arcs present is compared against those in the gate level netlist and a PASS/FAIL type of check may be provided without involving the timing.

The ETM Verification Module 203 may also provide an engineer a summary of the results from the validation process. This summary may include the parameters that pass the validation, the parameters that fail the validation and parameters that may have passed but generated a warning.

B. Data Template Creation Module

Figure 3:
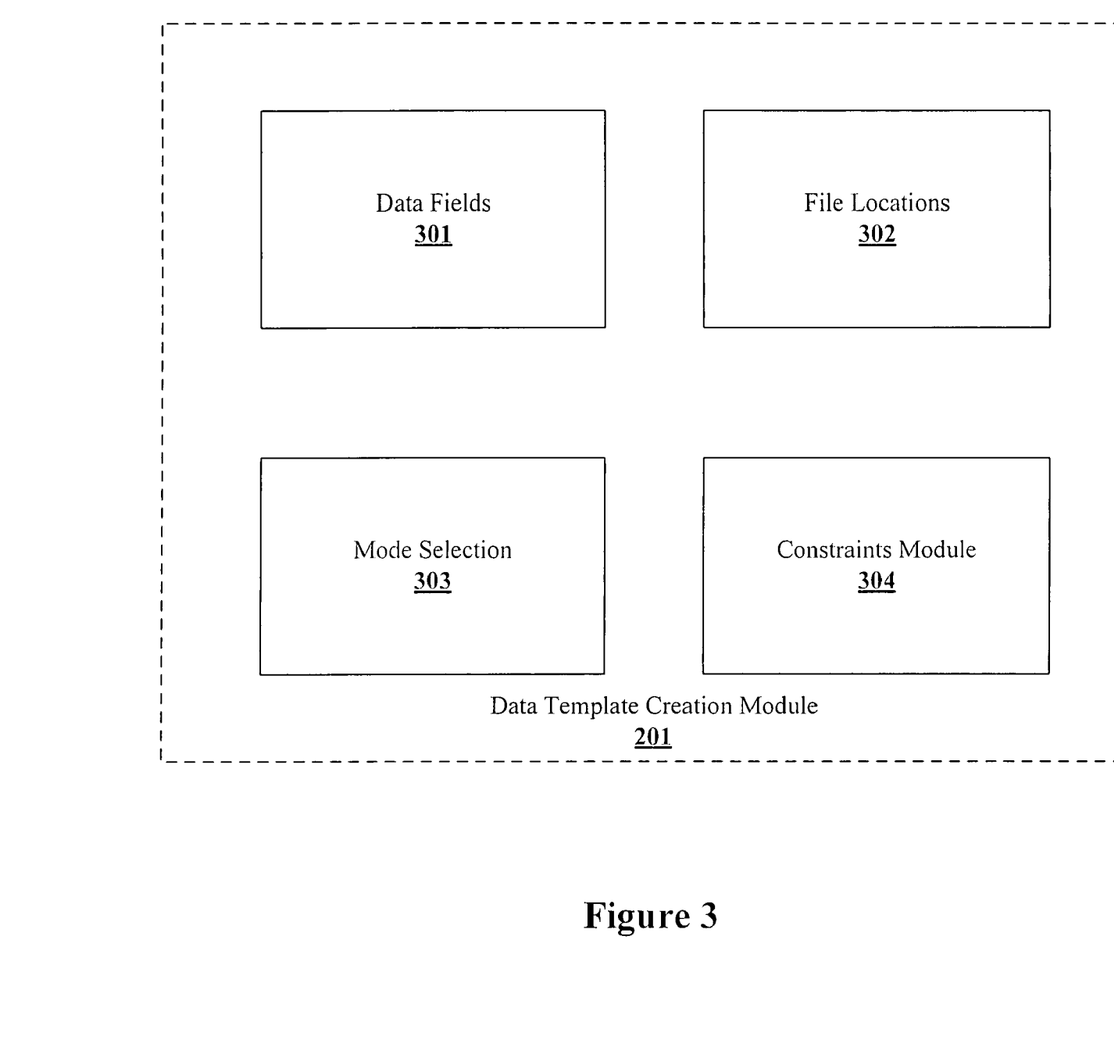
FIG. 3 illustrates an apparatus for creating and providing data templates used to generate all extracted timing model according to one embodiment of the invention.

FIG. 3 illustrates one embodiment of the Data Template Creation Module 201. This module 201 comprises different sub-modules including Data Fields 301, File Locations 302, Mode Selections 303 and a Constraint Module 304. As explained earlier, the Data Template Creation Module 201 is provided to the user to input various details about a cell or core including what type of technology is being modeled, location of relevant files including spef. files and verilog netlists, map files, source clock names, minimum periods and maximum clock frequencies, rate characterizations of the core, timing constraints, modes of operation, other clock frequencies etc. The various sub-modules allow a user to input this information within the Module 201 itself via a user interface or in response to a particular questions generated by the Module 201.

The Constraint Module 304 provides timing constraints for timing arcs associated with output and/or input pins. These timing arcs in the ETM models are checked to determine whether they match the timing of the gate level implementation within a specified range. For example if the range is set to be +/−25 ps, then an error may be flagged if the ETM timing arc is say 370 ps but the gate level timing arc is 420 ps.

Additionally, the present invention provides an easy process of creating delay tables inside the models. The invention enables the user to manipulate the delay tables according to the change in cross talk margin flow that changes according to the core speed and the tables may be updated to interpret this timing information accordingly.

The timing information may also change with modification to the modes of operation. These modes include plurality of test modes and the functional modes. Depending upon which mode a cell or core is operating, the timing behaviors and characteristics of the cell or core may change. These changes may be modeled within the ETM and a switch provided to change the mode of operation and to update the timing information accordingly.

C. Extracted Time Model Generation Module

Figure 4:
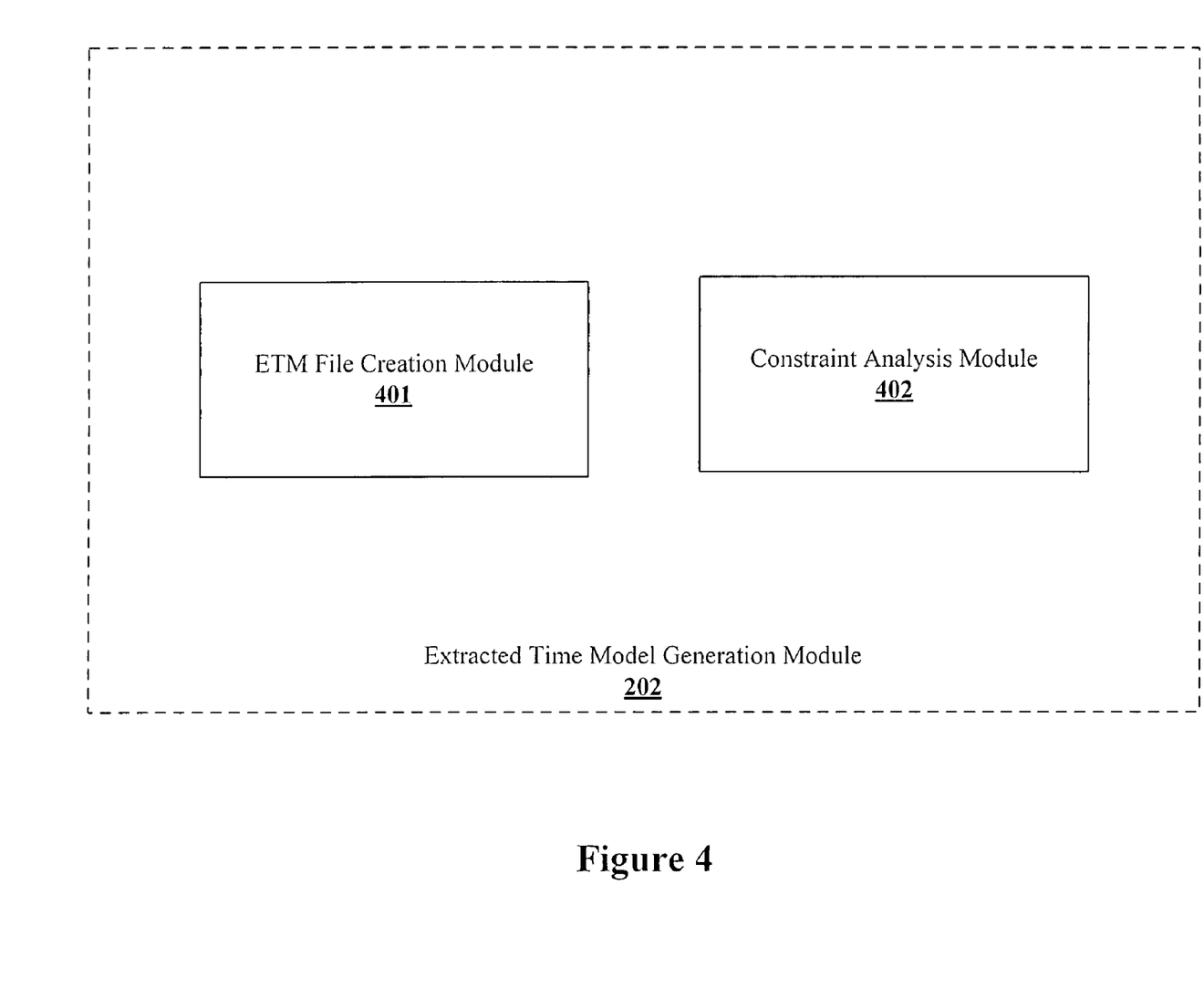
FIG. 4 illustrates an apparatus for generating an extracted timing model according to one embodiment of the invention.

FIG. 4 shows the Extracted Time Model Generation Module 202 according to one embodiment of the invention. As shown in this embodiment, the Module 202 contains an ETM File Creation Module 401 and the Constraint Analysis Module 402. The ETM File Creation Module 401 receives the information in the Data Template Creation Module 201 and generates a .lib file and .db file. As explained above, the library file is created so that the timing information of an IP block, cell and/or core can be calculated and the library cell can replace the internal netlist of a design. The timing tables in the library file may be modified by using this Module 202.

The Constraint Module 402 verifies that the generated .lib file is consistent with one or more test criteria. In one embodiment, a test bench is created having multiple test points to which information within the generated file is tested. One skilled in the art will recognize that various different characteristics may be analyzed and tested using the test points within the test bench. For example, a transition time on an input and a capacitive loading time on an output may be selected. This timing information may then be compared to information within the ETM file and timing arcs within the gate-level netlist for verification of the test point. One skilled in the art will recognize that numerous different core characteristics may be monitored and verified by the Module 402 to ensure that an appropriate file is generated.

Timing constraints are often the stumbling block for closing timing on a design and are also a crucial part of creating a good ETM. This constraint checking may be hidden from the user or may include active participation by the user. At the end of the ETM run, a .lib model and a .db model are created.

In one embodiment of the invention, the Extracted Time Model Generation Module 202 may also generate an "ideal-clk" mode equivalent for each functional mode. This particular mode is used for EDA tools that are unable to handle real clock delay information, such as a pre-layout STA or those tools optimizing the design before the clock tree is implemented. In one embodiment of the invention, "idealclk" means the timing arc is calculated with the clock delay portion of the arc zeroed out.

D. Validation of Extracted Timing Model File

Figure 5:
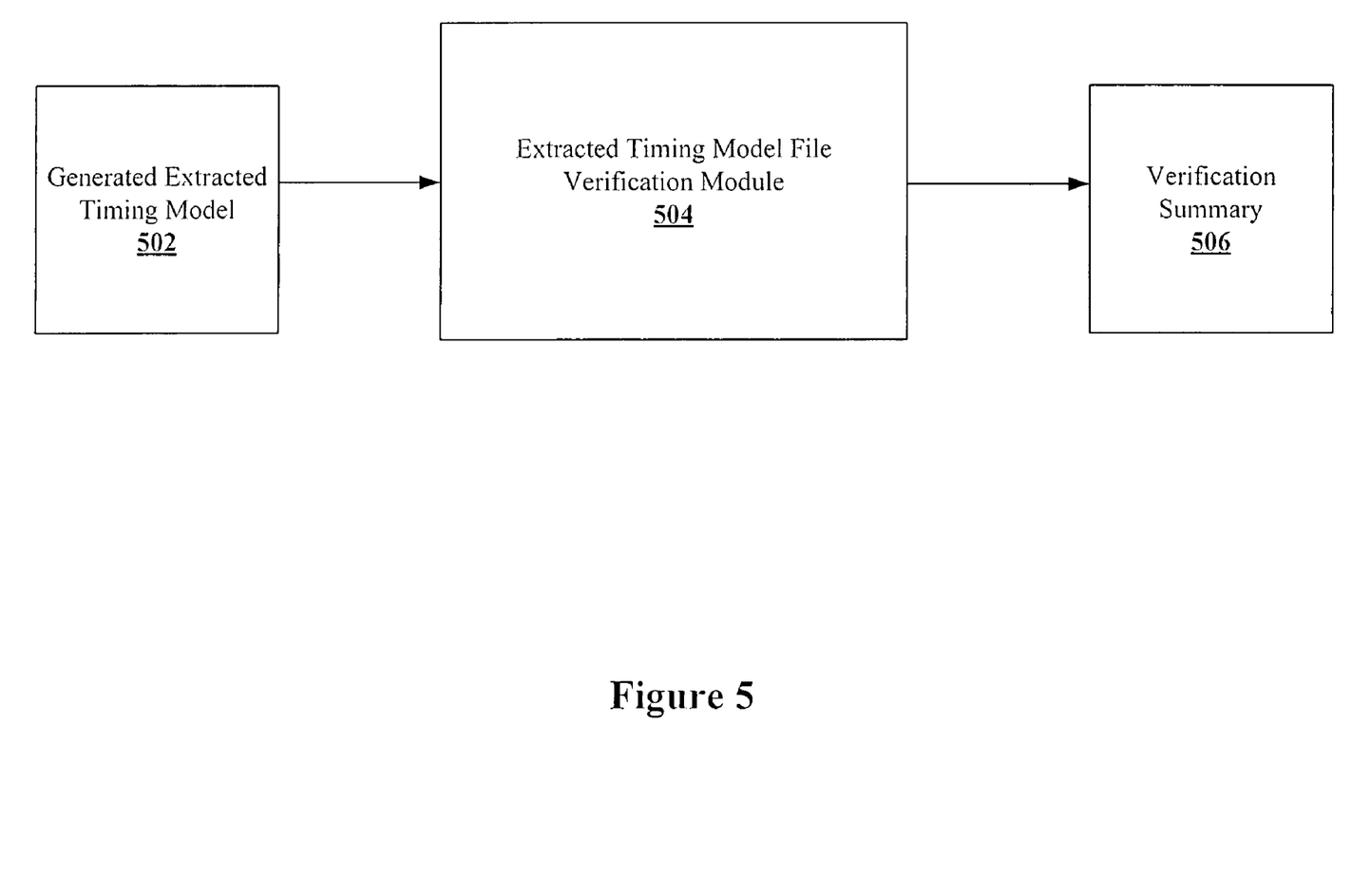
FIG. 5 is a general block diagram illustrating verification of an extracted timing model according to one embodiment of the invention.

FIG. 5 illustrates, at a high level, a validation process in which the accuracy of an ETM file is verified. A timing model file created using the Extracted Time Model Generation Module 202 may be analyzed and validated for inconsistencies, errors or other problems that may prevent the file from operating properly. In one embodiment of the invention, the generated extracted timing model file 502 is provided to an Extracted Timing Model Verification Module 504. The Extracted Timing Model Verification Module 504 compares characteristics of the file 502 to a test bench containing different test points that may be used to analyze the correctness of the generated file 502. The test points may relate to a plurality of criteria that may be applied to the ETM file validation process.

The Extracted Timing Model Verification Module 504 provides a user a summary 506 of the validation process after it has completed. This summary 506 may describe some or each of the test point results generated during the verification. The summary 506 may also include a list of validation criteria that pass, criteria that fail and criteria that pass but raise potential warnings and should be double checked. One skilled in the art will recognize that various type of information may be provided to the user as a result of the validation process.

Figure 6:
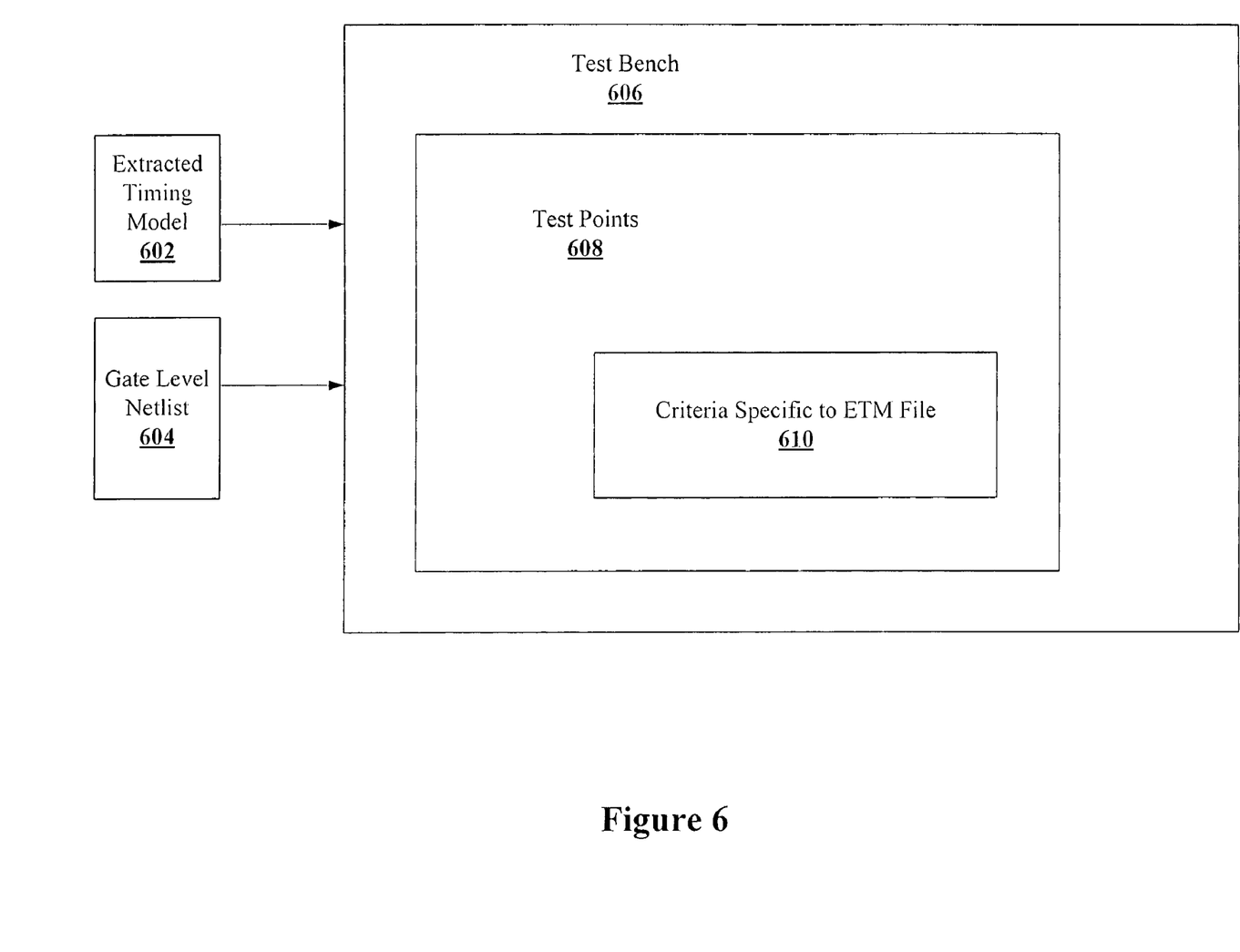
FIG. 6 is a block diagram of an extracted timing module verification module according to one embodiment of the invention.

FIG. 6 is a general block diagram describing how a verification process is performed according to one embodiment of the invention. As shown, an ETM file 602 and a gate level netlist 604 are provided to a test bench 606. The test bench contains a plurality of test points 608 including a set of criteria specific to the ETM file 602.

The test bench 606 provides validation criteria 610, specific to the ETM File 602, which are compared to the generated ETM file 602. In one embodiment of the invention, the validation process may automatically be initiated after an ETM file is generated or may be initiated by a user at some period of time after the file is created. In either event, the ETM file 602 is provided to the test bench 606. Other files, such as the gate level netlist corresponding to the ETM file 602, may also be provided depending on the design of the test bench 606.

As described above, the validation process involves a test bench 606 that combines a plurality of test points with information specific to the ETM file 602 to generate validation criteria 610 used to validate the file 602. In particular, the validation criteria 610 are generated by analyzing the test points 608 and other files, Such as the netlist 604, so that particular values or value ranges are generated that define correct characteristics of the ETM file 602. These test points may include data surrounding input times and output loads, minimum period attributes, and area value associated with the implementation of the ETM file. This procedure allows the test bench 606 to create validation criteria 610 for different ETM files while maintaining a level of consistency as to which characteristics of an ETM file is validated.

One skilled in the art will recognize that numerous different ETM file characteristics may be validated. Furthermore, one skilled in the art will recognize that test values or criteria relating to these characteristics may be generated using multiple different methods. Further yet, one skilled in the art will recognize that the order in which the validation process occurs may be modified depending on the ETM file, or the particular characteristics thereof, being validated.

E. Method for Validating an ETM File

Figure 7:
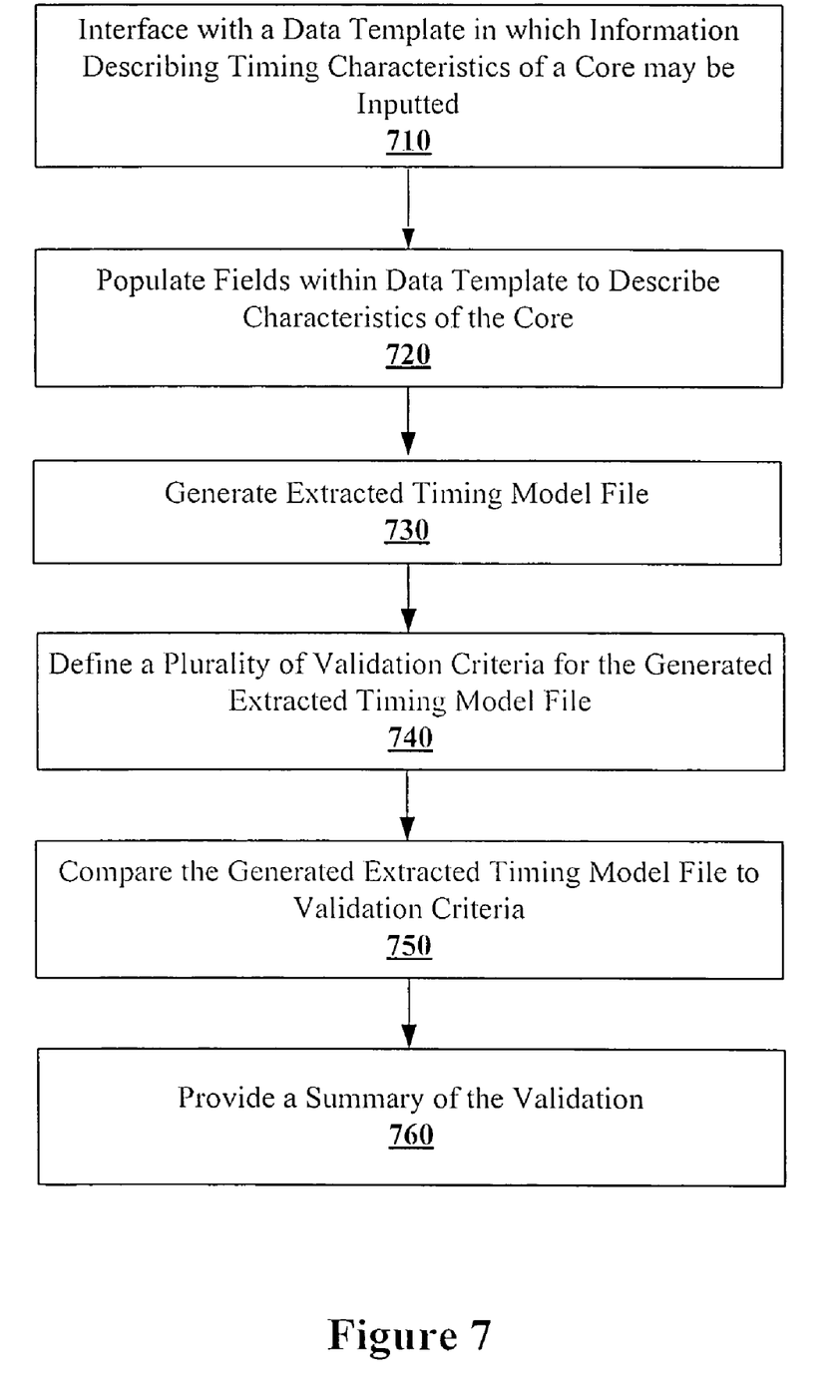
FIG. 7 illustrates a method that generates an extracted timing model according to one embodiment of the invention.

FIG. 7 illustrates a method, independent of structure, for generating and validating an ETM file, such as a .lib file, according to one embodiment of the invention. A user interfaces 710 with a data template that will be used to generate an ETM file. This data template may receive and contain information describing timing characteristics of a core and may provide specific questions intended to illicit this information.

The user populates 720 fields within the data template in order to provide this timing characteristic information. The fields may be provided in various formats depending on the type of question associated with the field or particular application of the information. The user may also identify one or more modes of operation associated with the core operation. Additionally, the user may provide a location or file address of a core netlist and/or other related files describing the core.

Using the information within the data template, including the modes of operation and file locations, an ETM file is automatically generated 730. This file may be various types of ETM files including a .lib file or .db file. This automated file generation greatly reduces the time expenditure and complexity of creating ETM files prior to the invention.

A plurality of validation criteria is generated 740 to which tile generated ETM file is compared. In one embodiment, the validation criteria is generated by analyzing test points within a test bench and a net list associated with the core for which the ETM file was generated. These validation criteria are compared 750 to the ETM file to verify that characteristics of the ETM file fall within an appropriate value range. This comparison detects errors in the ETM file either caused by the user inputting information into the data template or the subsequent generation of the ETM file.

After the validation process, a summary is provided 760 in which the user is notified about the comparison results of the ETM validation criteria. This summary may be provided to the user via various medium including on a display, in a printout, etc. Furthermore, the user may be notified which criteria passed, which criteria failed, and which criteria generated a warning indicating that it should be double checked. One skilled in the art will recognize that other aspects of the validation process may be provided to the user within the summary.

The foregoing description of the invention has been described for purposes of clarity and understanding. It is not intended to limit the invention to the precise form disclosed. Various modifications may be possible within the scope and equivalence of the appended claims.

We claim:

1. A method for generating and validating an extracted timing model file of a cell, the method comprising steps of:
   providing an interface for user input of information about at least one timing characteristic related to the cell;
   generating an extracted timing model file using the information about the at least one timing characteristic;
   receiving the extracted timing model file having the at least one timing characteristic;
   providing a test bench having at least one test point from which at least one validation criteria is generated;
   comparing the at least one timing characteristic to the at least one validation criteria; and
   validating the extracted timing model file based on the comparison of the at least one timing characteristic and the at least one validation criteria;

wherein each of the steps is performed by at least one computing device.

2. The method of claim 1 further comprising the step of providing a summary of the comparison of the at least one timing characteristics and the at least one validation criteria.

3. The method of claim 2 wherein the summary contains a list of criteria that failed the validating process.

4. The method of claim 2 wherein the summary contains a list of criteria that passed the validating process but generate a warning due to potential errors in the list of criteria.

5. The method of claim 1 further comprising the step of receiving additional data, related to the cell, which is used to generate the at least one validation criteria.

6. The method of claim 5 wherein the additional data includes a netlist related to the cell.

7. The method of claim 1 wherein the at least one test point includes timing arcs associated with the cell.

8. The method of claim 1 wherein the at least one test point includes a minimum clock period.

9. The method of claim 1 wherein the at least one test point includes a mode of operation.

10. The method of claim 9 wherein the mode of operation is a test mode of the extracted timing model file.

11. The method of claim 1 wherein the extracted timing model is a .lib file.

12. An apparatus for generating and validating an extracted timing model file for a cell, the apparatus comprising:

a data template creation module, receiving input from a user, that provides an interface in which information about one or more cell timing characteristics is provided; and an extracted timing model generation module, coupled to receive the information about the cell timing characteristics, that generates an extracted timing model file using the information about the cell timing characteristics;

an extracted timing model verification module, coupled to receive the extracted timing model file, that compares at least one of the one or more cell timing characteristics to at least one validation criteria and that validates the extracted timing model file based on the comparison of the at least on of the one or more cell timing characteristics and the at least on validation criteria;

wherein the extracted timing model verification module comprises a test bench having at least one test point from which the at least one validation criteria is generated.

13. The apparatus of claim 12 wherein the extracted timing model file is a .lib file.

14. The apparatus of claim 12 wherein the a test bench has a plurality of test points that define characteristics of extracted timing model files.

15. The apparatus of claim 14 wherein the test bench receives additional information, related to the cell, and generates validation criteria using the additional information and the test points.

16. The apparatus of claim 15 wherein the additional information comprises a netlist associated with the cell.

17. The apparatus of claim 15 wherein a netlist of the core being modeled may be provided in the file location field.

18. A computer program product embodied on a computer storage medium for generating and validating an extracted timing model file of a cell, the computer program product comprising computer executing:

providing an interface for user input of information about at least one timing characteristic related to the cell;

generating an extracted timing model file using the information about the at least one timing characteristic;

receiving the extracted timing model file having the at least one timing characteristic;

providing a test bench having at least one test point from which at least one validation criteria is generated;

comparing the at least one timing characteristic to the at least one validation criteria; and validating the extracted timing model file based on the comparison of the at least one timing characteristic and the at least one validation criteria.

19. The computer program product of claim 18 further comprising computer instructions for providing a summary of the comparison of the at least one timing characteristics and the at least one validation criteria.

20. The computer program product of claim 18 further comprising computer instructions for receiving additional data, related to the cell, which is used to generate the at least one validation criteria.

21. The computer program product of claim 20 wherein the additional data includes a netlist related to the cell.

* * * * *